(12) United States Patent
Choi et al.

(10) Patent No.: US 7,718,535 B2
(45) Date of Patent: May 18, 2010

(54) SLURRY COMPOSITIONS AND CMP METHODS USING THE SAME

(75) Inventors: Jaekwang Choi, Suwon-si (KR); Jae-Dong Lee, Suwon-si (KR); Chang-Ki Hong, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 189 days.

(21) Appl. No.: 11/984,399

(22) Filed: Nov. 16, 2007

(65) Prior Publication Data

US 2008/0124913 A1 May 29, 2008

Related U.S. Application Data

(62) Division of application No. 10/807,139, filed on Mar. 24, 2004, now Pat. No. 7,314,578.

(30) Foreign Application Priority Data

Dec. 12, 2003 (KR) .................. 10-2003-0090551

(51) Int. Cl.
  *H01L 21/306* (2006.01)
(52) U.S. Cl. .................. 438/692; 257/E21.23
(58) Field of Classification Search .......... 438/692, 438/693; 257/E21.23
  See application file for complete search history.

(56) References Cited

U.S. PATENT DOCUMENTS

| 6,776,810 B1 | 8/2004 | Cherian et al. |
| 6,811,470 B2 | 11/2004 | Bonner et al. |
| 2002/0132404 A1* | 9/2002 | Chen et al. ........... 438/197 |
| 2003/0040182 A1* | 2/2003 | Hsu et al. ............. 438/692 |

FOREIGN PATENT DOCUMENTS

JP          10-102040         4/1998

(Continued)

OTHER PUBLICATIONS

Lee et al., "Effects of Nonionix Surfactants On Oxide-to-Polysilicon Selectivity Duiring Chemical Mechanical Polishing". Journal of the Electrochemical Society, 149 (8), p. 477-481.*

(Continued)

*Primary Examiner*—W. David Coleman
*Assistant Examiner*—Daniel Shook
(74) *Attorney, Agent, or Firm*—Harness, Dickey & Pierce, P.L.C.

(57) ABSTRACT

The exemplary embodiments of the present invention providing new slurry compositions suitable for use in processes involving the chemical mechanical polishing (CMP) of a polysilicon layer. The slurry compositions include one or more non-ionic polymeric surfactants that will selectively form a passivation layer on an exposed polysilicon surface in order to suppress the polysilicon removal rate relative to silicon oxide and silicon nitride and improve the planarity of the polished substrate. Exemplary surfactants include alkyl and aryl alcohols of ethylene oxide (EO) and propylene oxide (PO) block copolymers and may be present in the slurry compositions in an amount of up to about 5 wt %, although much smaller concentrations may be effective. Other slurry additives may include viscosity modifiers, pH modifiers, dispersion agents, chelating agents, and amine or imine surfactants suitable for modifying the relative removal rates of silicon nitride and silicon oxide.

20 Claims, 8 Drawing Sheets

FOREIGN PATENT DOCUMENTS

| | | |
|---|---|---|
| JP | 2001-110760 | 4/2001 |
| KR | 1020020077636 | 10/2002 |

OTHER PUBLICATIONS

"Effects of Nonionic Surfactants On Oxide-to-Polysilicon Selectivity During Chemical Mechanical Polishing", Journal of the Electrochemical Society, 149(8), Lee et al., pp. 477-481.

Korean Office Action dated Mar. 28, 2006.

Chinese Office Action dated Oct. 16, 2009 in corresponding Chinese Application No. 2008101311021.

Lee et al., "Effects of Nonionic Surfactants on Oxide-to-Polysilicon Selectivity during Chemical Mechanical Polishing", Journal of the Electrochemical Society, 149 (8), pp. G477-G481 (2002).

* cited by examiner

SLURRY COMPOSITIONS AND CMP METHODS USING THE SAME

CROSS-REFERENCE TO RELATED APPLICATION

This application is a divisional application of U.S. application Ser. No. 10/807,139, filed on Mar. 24, 2004, now U.S. Pat. No. 7,314,578 the entirety of which hereby is incorporated herein by reference This application claims priority from Korean Patent Application No. 10-2003-0090551, which was filed on 12 Dec. 2003 in the Korean Intellectual Property Office, the disclosure of which is incorporated herein in its entirety by reference.

BACKGROUND OF THE INVENTION

1. Field of the Invention

The present invention relates to slurry compositions and methods using such slurry compositions for the chemical mechanical polishing (CMP) of material layers deposited during the manufacture of semiconductor devices, more particularly to slurry compositions including one or more additives for adjusting the relative removal rates of different materials, and most particularly to slurry compositions including one or more additives for reducing the removal rate of polysilicon relative to other materials present on a semiconductor substrate.

2. Description of the Related Art

The increasing demand for high performance semiconductor devices and the corresponding demand for increased degrees of integration for modern semiconductor devices require the use of fine pitch multilayer interconnection structures. These multilayer interconnection structures are typically formed by processes that involve sequential insulator deposition, patterning, etching, conductor deposition and planarization steps. The planarization steps are particularly important for providing a substantially planar surface for subsequent deposition and patterning processes that can consistently produce patterns having critical dimensions falling within narrow sizing ranges.

A variety of planarization methods have been utilized depending on the particular semiconductor fabrication process and the specific patterns and material layers being used at a particular step within the fabrication process. Planarization techniques have included forming a layer or a coating of an insulator, such as silicon dioxide, a conductor, such as copper, a resin, such as polyimide, a spin-on-glass (SOG), or a doped glass, such as borophosphosilicate glass (BPSG), followed by one or more processes such as etch-back, reflow, and/or CMP steps to obtain a more planar surface for subsequent processing.

In CMP processes, the semiconductor substrate is typically mounted on a rotating plate or other holder, and the surface of the substrate is then brought into contact with a polishing surface of a polishing pad. Portions of the material layers and/or patterns formed on the substrate are then removed by causing relative motion between the substrate and the polishing pad while providing a supply of one or more slurry compositions to the polishing surface of the polishing pad. Depending on the materials being removed, a CMP process may be primarily mechanical, wherein the material is removed by an abrasive, or a combination of chemical action between one or more components of the slurry and the one or more of the materials being removed and the mechanical action of the polisher.

During the planarizing process, the polishing surface of the polishing pad will typically be continuously wetted with an abrasive slurry and/or a planarizing liquid to produce the desired planarizing surface. The substrate and/or the planarizing surface of the pad are then urged into contact to establish a planarizing load or pressure and moved relative to one another to cause the planarizing surface to begin removing an upper portion of the material layer. The relative motion of the substrate and the polishing surface can be simple or complex and may include one or more lateral, rotational, revolving or orbital movements by the planarizing pad and/or the substrate in order to produce generally uniform removal of the material layer across the surface of the substrate.

As used herein, lateral movement is movement in a single direction, rotational movement is rotation about an axis through the center point of the rotating object, revolving movement is rotation of the revolving object about a non-centered axis and orbital movement is rotational or revolving movement combined with an oscillation. Although, as noted above, the relative motion of the substrate and the planarizing pad may incorporate different types of movement, the motion must typically be confined to a plane substantially parallel to the surface of substrate in order to achieve a planarized substrate surface.

The particular slurry composition, as well as the parameters under which the CMP are conducted will typically be a function of the particular characteristics of the various primary and secondary materials to be removed from the substrate surface. In particular, in a case where a polysilicon layer and a silicon oxide layer are being polished using a silica-based slurry using silica ($SiO_2$) as primary abrasive, the removal rate of the polysilicon will tend to be higher than the removal rate of the silicon oxide. These differing removal rates for different materials under substantially identical polishing conditions are typically expressed as a selectivity ratio. CMP processes are commonly arranged to take advantage of these differences in removal rate by providing a polishing stopping layer, e.g., a material with a much lower removal rate, below the primary layer of material being removed to allow sufficient overpolishing to account for variations in layer thicknesses and wafer planarity. This overpolishing increases the likelihood that substantially all of the intended material layer can be removed without damaging the underlying patterns. In certain instances, however, it may not be possible or practical to utilize a polishing stopping layer, or the relative characteristics of the materials being removed can tend to result in "dishing" or "cupping" of the more easily removed material and produces a more non-planar surface than desired and may compromise subsequent processing.

For example, as illustrated in FIGS. 1A-D, the removal of the upper portion of a polysilicon layer deposited over a silicon nitride pattern can result in a substantially non-planar surface. As illustrated in FIG. 1A, a substrate 100 has an active region 102 separated by isolation regions 104. The active region 102, will also typically include one or more doped regions (not shown) to which electrical contact must be made in order for the final semiconductor device to operate properly. A pattern of gate electrodes 106 or other structures are then formed on the substrate. The gate electrodes 106, which may have a stacked structure including polysilicon 108 and a metal silicide 110, formed by reacting a metal, such as tungsten, cobalt or nickel, or a metal alloy with a portion of the polysilicon, are protected by an insulating spacer structure 112, typically including silicon dioxide and/or silicon nitride. Between the spacer structures 112, contact portions of the surface of the semiconductor substrate will be exposed and a polysilicon layer 114 will be deposited on the structure as a means of establishing electrical contact to the substrate.

As illustrated in FIG. 1B, the upper portion of the polysilicon layer 114 is then removed to form polysilicon plugs 114a between the spacer structures 112. However, because polysilicon may be removed at a rate greater than the rate at which silicon oxide or silicon nitride are removed, in some instances as much as 50 to 100 times greater, there is a tendency for excessive polysilicon to be removed, forming depressions 116 between the spacer structures and produce a non-planar surface. As illustrated in FIG. 1C, once the CMP process has been completed, an interlayer dielectric layer (ILD) 118, may be deposited on the substrate. A photoresist contact pattern (not shown) will then be formed on the ILD 118 and the ILD material etched to form contact openings 120 that extend through the ILD to expose a surface of the polysilicon pads or plugs 114a.

However, as a result of the excessive polysilicon removal, the surface of the polysilicon plugs 114a is recessed relative to the upper surfaces of the spacer structures 112, increasing the thickness of the ILD 118 that must be removed to open the contacts. This increased thickness can result in problems such as the underetch condition illustrated in FIG. 1E wherein the etch is not sufficient to open some or all of the contact openings, leaving regions of residual ILD 118a in the bottom of the contact openings. Similarly, as illustrated in FIG. 1F, in those instances in which the depth of the etch is sufficient to reach the polysilicon, but the contact pattern is misaligned, the contacts openings can expose the gate electrodes 106 or other conductive structures, causing shorts in region S. Both opens and shorts will reduce the process yield and/or reduce the reliability of the final semiconductor devices.

SUMMARY OF THE INVENTION

The exemplary embodiments of the present invention address the noted problems of the conventional CMP processes by providing new slurry compositions that are suitable for use in processes involving the chemical mechanical polishing (CMP) of a polysilicon layer to reduce or eliminate the excessive removal of the polysilicon layer.

Exemplary embodiments of the present invention include methods of manufacturing semiconductor devices incorporating CMP processes that utilize slurry compositions and/or one or more slurry additives to reduce or eliminate the excessive removal of the polysilicon layer. In particular, the CMP processes according to exemplary embodiments of the invention incorporate one or more non-ionic surfactants to provide selective control over the removal rate of polysilicon relative to silicon oxide and silicon nitride. Exemplary surfactants include copolymer alcohols of ethylene oxide (EO) and propylene oxide (PO) and may be present in the slurry compositions in an amount of up to about 5 wt %. Other slurry additives may include one or more amine or imine surfactants intended to modify the relative removal rates of silicon nitride and/or silicon oxide.

BRIEF DESCRIPTION OF THE DRAWINGS

Exemplary embodiments of the devices and methods that may be utilized to practice the present invention are addressed more fully below with reference to the attached drawings in which.

Figure 1A:
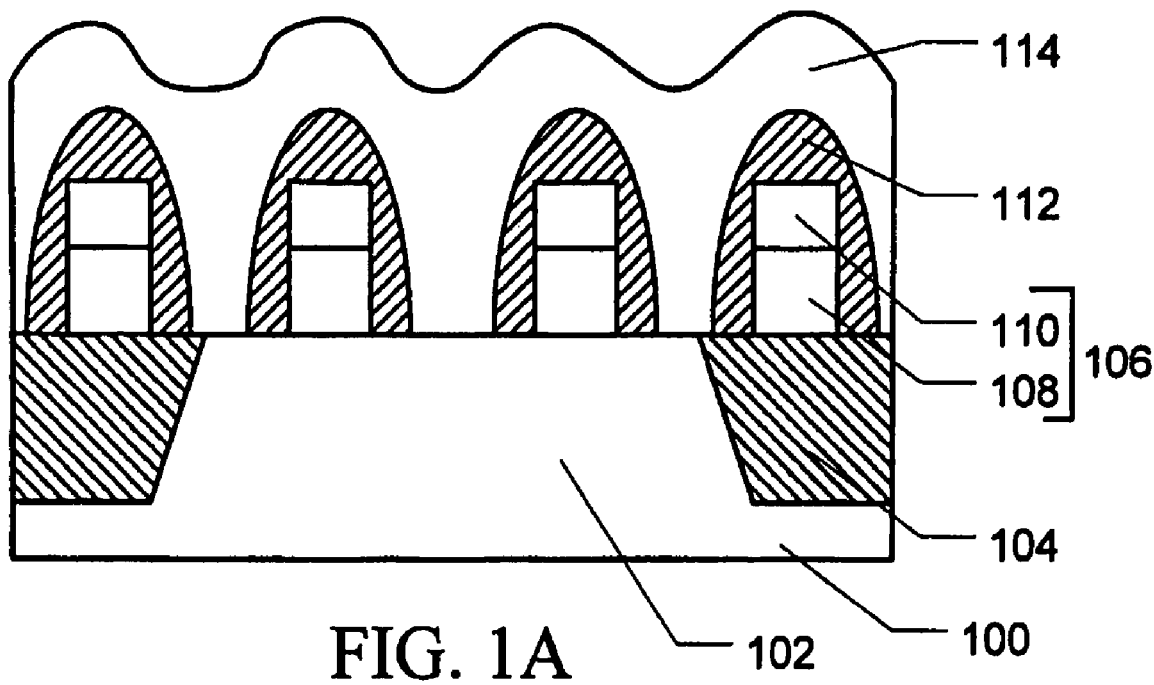
FIGS. 1A-F illustrate certain of the process steps in a conventional CMP method as well as certain characteristic problems associated with such processes.
Figure 1B:
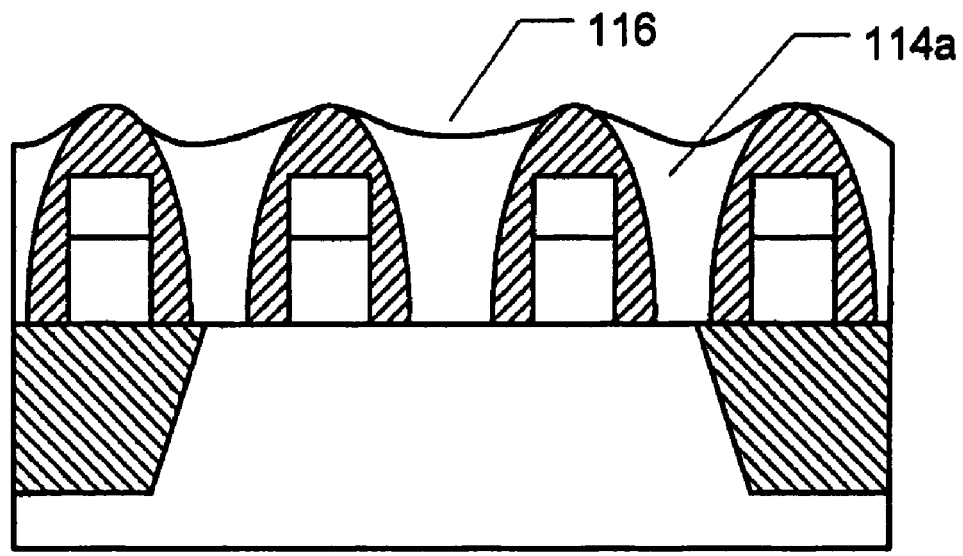
Figure 1C:
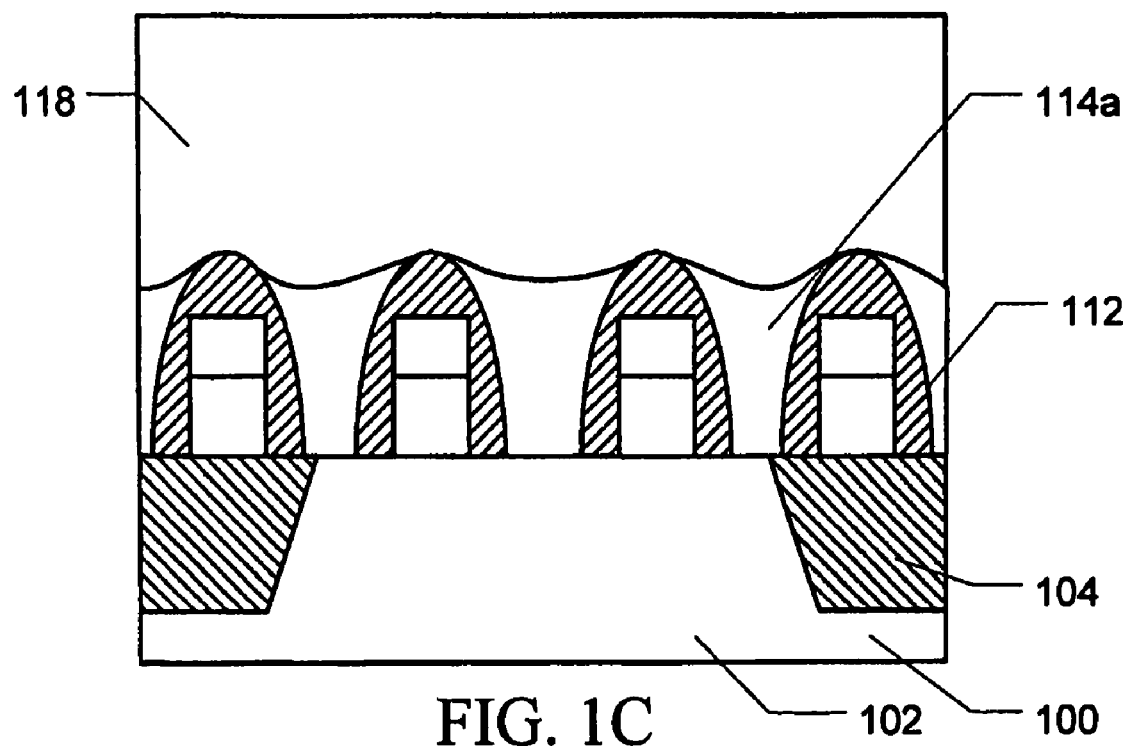
Figure 1D:
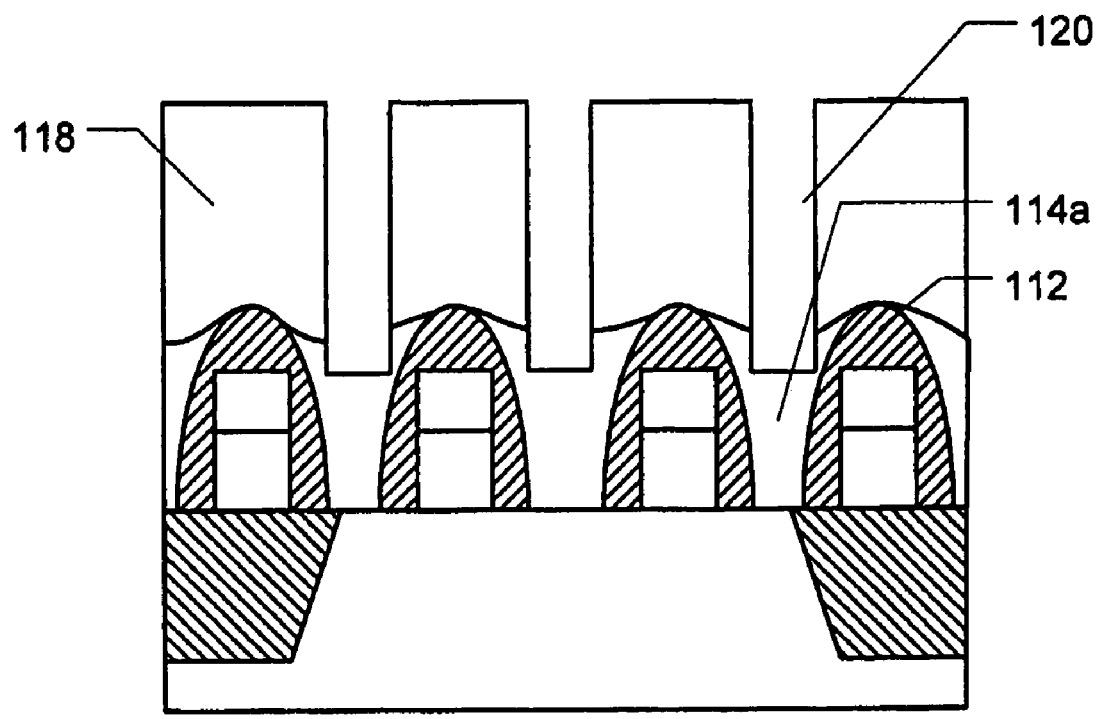

It should be noted that these Figures are intended to illustrate the general characteristics of methods and materials of exemplary embodiments of this invention, for the purpose of the description of such embodiments herein. These drawings are not, however, to scale and may not precisely reflect the characteristics of any given embodiment, and should not be interpreted as defining or limiting the range of values or properties of embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

DETAILED DESCRIPTION OF EXEMPLARY EMBODIMENTS

Accordingly, the exemplary embodiments of the present invention comprise or incorporate a slurry composition for the chemical mechanical polishing of a polysilicon layer that includes at least a carrier liquid, abrasive particles, and a polymeric surfactant that includes both hydrophilic and hydrophobic functional groups. The polymeric surfactant will include at least one polymer alcohol including ethylene oxide (EO) and propylene oxide (PO), either as a copolymer or as a triblock polymer.

When used for polishing polysilicon, the hydrophobic functional groups of the polymeric surfactant attach preferentially to the exposed polysilicon surface, thereby forming a passivation layer. This passivation layer is sufficient to reduce the removal rate of the polysilicon layer relative to any exposed silicon oxide or silicon nitride surfaces and reduce or eliminate the excessive removal of polysilicon. The slurry composition may, of course, and preferably will include additional components such as wetting agents, solvents, viscosity modifiers, pH modifiers, and buffering agents.

The abrasive particles may include one or more fine abrasive materials, typically one or more inorganic oxides selected from a group consisting of silica, ceria, alumina, zirconia and titania and have an average particle size of between about 5 nm and 1 μm, preferably less than about 100 nm.

According to the present invention, when a CMP operation is performed on a hydrophobic material, typically polysilicon, the hydrophobic surface exposed to an exemplary slurry composition according to the present invention will accumulate or absorb a layer of the polymeric surfactant. The layer of the polymeric surfactant will, in turn, act as a passivation layer to protect the hydrophobic surface from the full effect of the polishing action of the slurry and the polishing pad. To the extent that any hydrophilic surfaces are exposed, however, they will not tend to accumulate or absorb a corresponding passivation layer of the polymeric surfactant and will, therefore, be removed at a more conventional rate by the polishing action of the slurry and polishing pad.

The Slurry Composition

Exemplary embodiments of slurry compositions according to the present invention will typically comprise a dispersion or suspension of abrasive particles in a primary carrier liquid, usually deionized water. A variety of aqueous slurry compositions are commercially available from companies known to those in the art comprising a variety of abrasive types and sizes tailored to the removal of silicon oxide, silicon nitride, polysilicon, silicides and metals, such as tantalum and copper. The abrasive(s) may be selected from a variety of oxides including silica, $SiO_2$, alumina, $Al_2O_3$, ceria, $CeO_2$, and magania, $Mn_2O_3$. The size distribution and quantity of the abrasive particles in the slurry will have a large effect on polishing efficiency and may range from about 1 to more than 30 wt % of the slurry composition, although about 5 to 20 wt % is probably more typical.

The primary slurry composition, i.e., the carrier liquid and the abrasive particles, may incorporate a variety of additives and/or may be selectively adjusted through the addition of one or more components as the slurry is being applied, or immediately prior to application, to the polishing surface. The additional components may include, for example, viscosity modifiers, anti-foaming agents, chelating agents and dispersal agents to obtain a slurry composition having the desired combination of properties.

The pH of the slurry composition may be controlled through the introduction of appropriate acids and bases, with or without corresponding buffering agents, to produce a slurry composition within a desired pH range. Maintaining a desired slurry pH may be accomplished with bases including potassium hydroxide, KOH, ammonium hydroxide, $NH_4OH$, trimethylamine, TMA, triethylamine, TEA, and tetramethylammonium hydroxide, TMAH or acids including sulfuric acid, $H_2SO_4$, nitric acid $HNO_3$, hydrochloric acid, HCl, or phosphoric acid, $H_3PO_4$, that may be added in small, controlled amounts to the slurry sufficient to adjust the pH to within the desired pH range.

The slurry composition will further include one or more non-ionic polymeric surfactants having both a hydrophilic functional group and a hydrophobic functional group. Polar groups, those containing oxygen, nitrogen and sulfur, such as —OH, —COOH, —$NH_2$, and —$SO_3H$ groups will tend to be hydrophilic, while aliphatic and aromatic hydrocarbon groups that do not also incorporate one or more polar groups will tend to be hydrophobic. Exemplary polymeric surfactants according to the present invention comprise a combination of ethylene oxide (EO) and propylene oxide (PO) in the form of a copolymer, i.e., $EO_x$—$PO_y$, or a triblock copolymer, i.e., $EO_x$—$PO_y$-$EO_z$ or $PO_x$-$EO_y$—$PO_z$, in a polymer alcohol. These exemplary polymeric surfactants will bind preferentially to the hydrophobic surface of polysilicon. The polymeric surfactant(s) may be included in the slurry composition in an amount between about 0.001 to 5 wt %, and will more typically comprise between about 0.05 and 0.2 wt % based on the dry weight of the slurry composition.

The exemplary ethylene oxide-propylene oxide block copolymer alcohols may be selected from a group consisting of a first group of alcohols that may be represented by the formula I

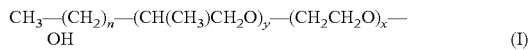
(I)

and a second group of alcohols that may be represented by the formula II

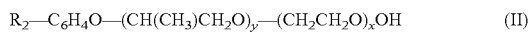
(II)

wherein $R_2$ is —$C_9H_{19}$ or —$C_8H_{17}$; $3 \leq n \leq 22$; $1 \leq y \leq 30$; and $1 \leq x \leq 30$. Preferred alcohols are those wherein both x and y are at least 5.

Similarly, the exemplary ethylene oxide-propylene oxide triblock copolymer alcohols may be selected from a group consisting of a first group of alcohols that may be represented by the formula III

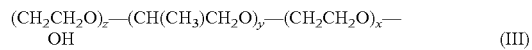
(III)

and a second group of alcohols that may be represented by the formula IV

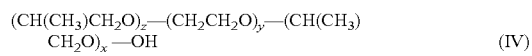
(IV)

wherein $1 \leq z \leq 30$; and $1 \leq y \leq 30$; and $1 \leq x \leq 30$. Preferred alcohols are those wherein both x, y and z are at least 5.

The slurry composition may also include addition surfactants designed to modify the relative removal rates of silicon oxide and silicon nitride for those instances in which the polysilicon layer 114 is deposited over structures that will expose both silicon oxide and silicon nitride surfaces during the CMP process. The composition, including the pH, of the abrasive slurry need not be constant over the entire course of the CMP process but may, instead, be modified as necessary to provide an acceptable combination of removal rates, planarity and economy. The particular slurry composition(s) can be changed incrementally or significantly as the particular composition and thickness of the material(s) being removed from the substrate varies over the course of the complete CMP process.

For example, in the absence of the exemplary polymeric surfactants, polysilicon removal rates on the order of 4500 Å/min may be achieved with conventional abrasive slurries. The addition of even minor amounts, e.g., less than 0.02 wt %, of the exemplary polymeric surfactants, however, can reduce the polysilicon removal rate to less than 2000 Å/min but will also tend to improve planarity. By delaying the application of the exemplary polymeric surfactant(s) to the polysilicon surface until a majority of the polysilicon layer has been removed at the higher removal rates allows the process throughput to be maintained at higher levels while providing the benefit of improved planarity and decreased material costs. Similar adjustments can, of course, be made to the pH of the slurry composition as well as the concentration of other components, thereby increasing the control of the CMP process.

Figure 2A:
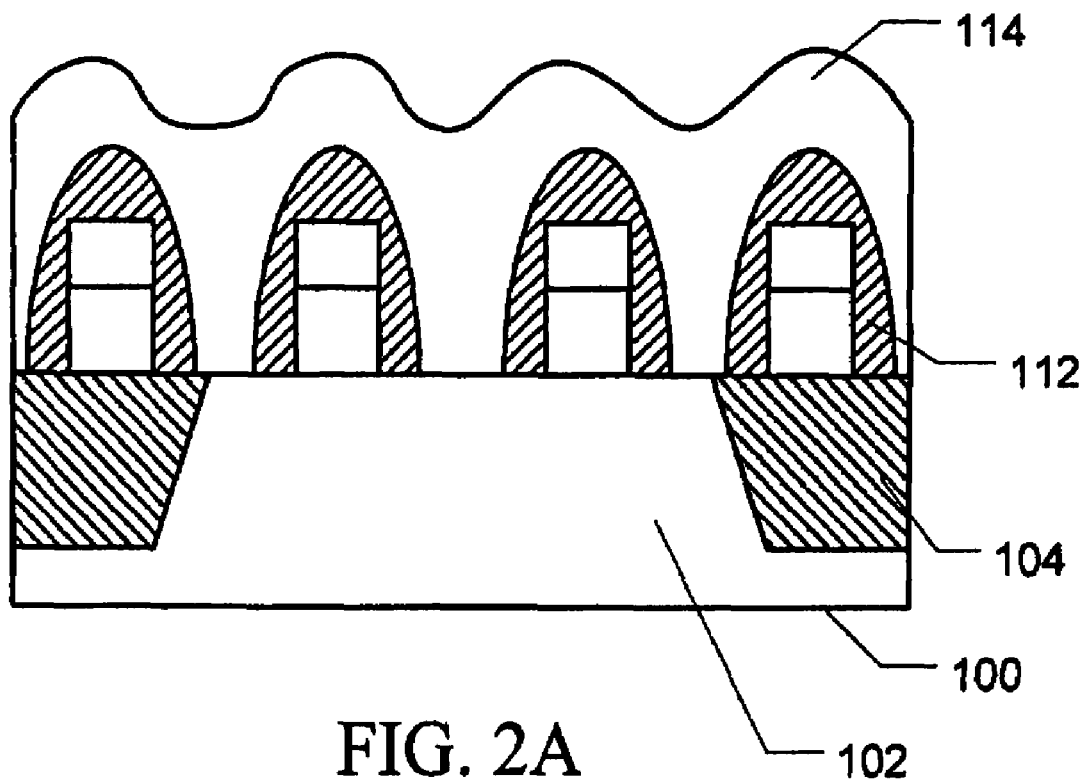
FIGS. 2A-G illustrate certain of the process steps in an exemplary CMP method according to the present invention.

The production of a semiconductor device with a CMP process utilizing an exemplary polymeric surfactant according to the present invention is illustrated in FIGS. 2A-D. As illustrated in FIG. 2A, a substrate 100 has an active region 102 separated by isolation regions 104. The active region 102, will also typically include one or more doped regions (not shown) to which electrical contact must be made in order for the final semiconductor device to operate properly. A pattern of gate electrodes 106 or other structures are then formed on the substrate. The gate electrodes 106, which may have a stacked structure including polysilicon 108 and a metal silicide 110, formed by reacting a metal, such as tungsten, cobalt or nickel, or a metal alloy with a portion of the polysilicon, are protected by an insulating spacer structure 112, typically including silicon dioxide and/or silicon nitride. Between the spacer structures 112, contact portions of the surface of the semiconductor substrate will be exposed and a polysilicon layer 114 will be deposited on the structure as a means of establishing electrical contact to the substrate.

Figure 2B:
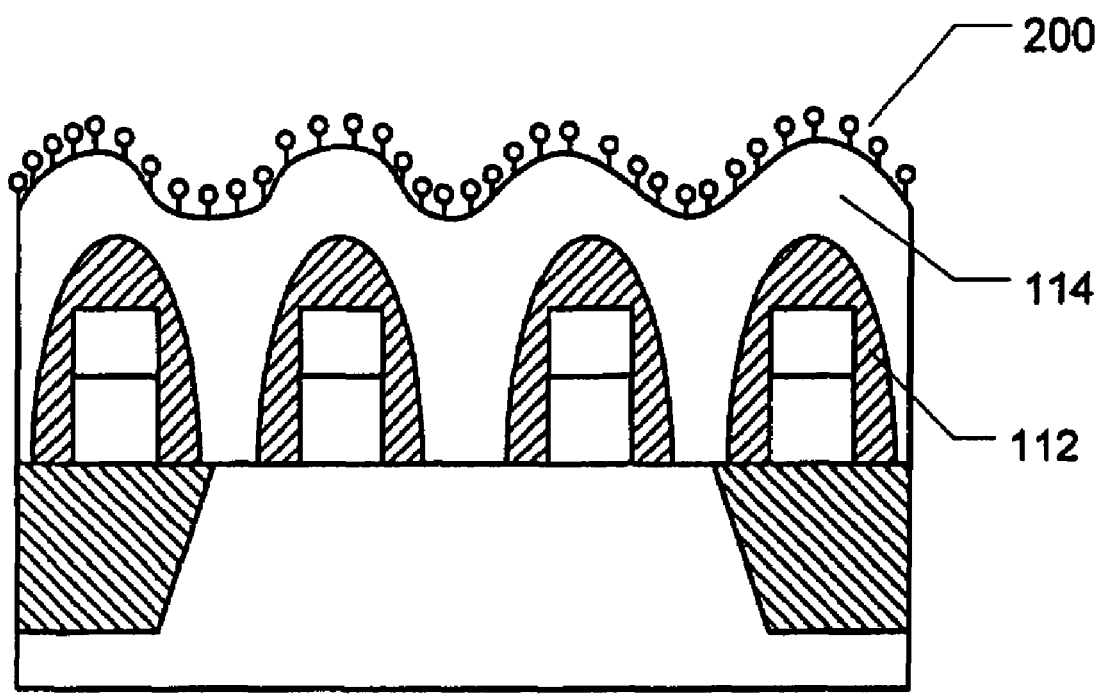
Figure 2C:
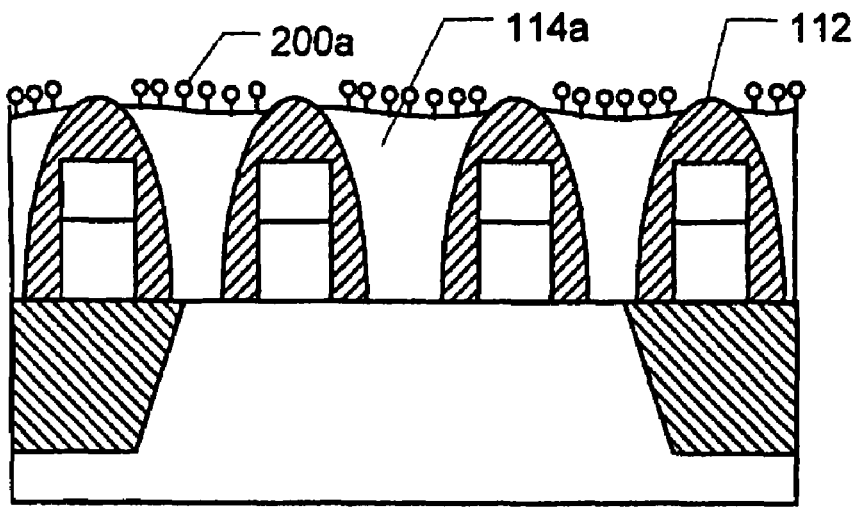
Figure 2D:
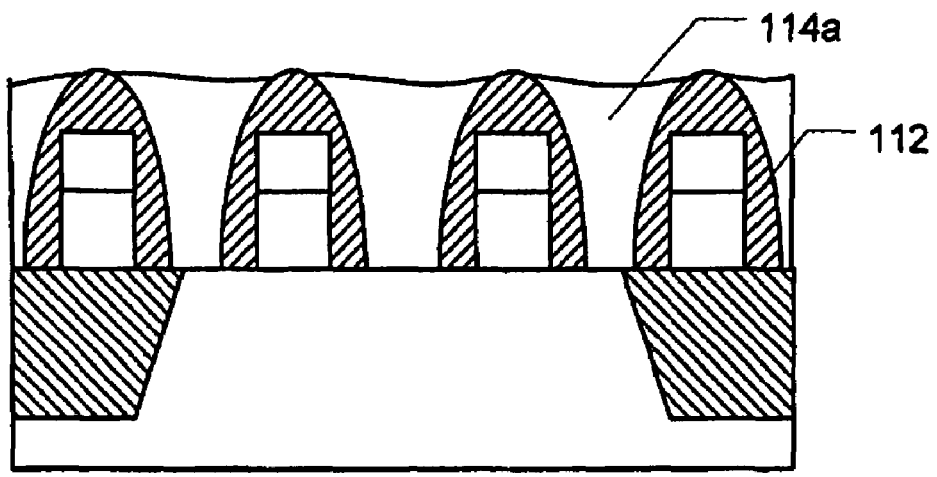
Figure 2E:
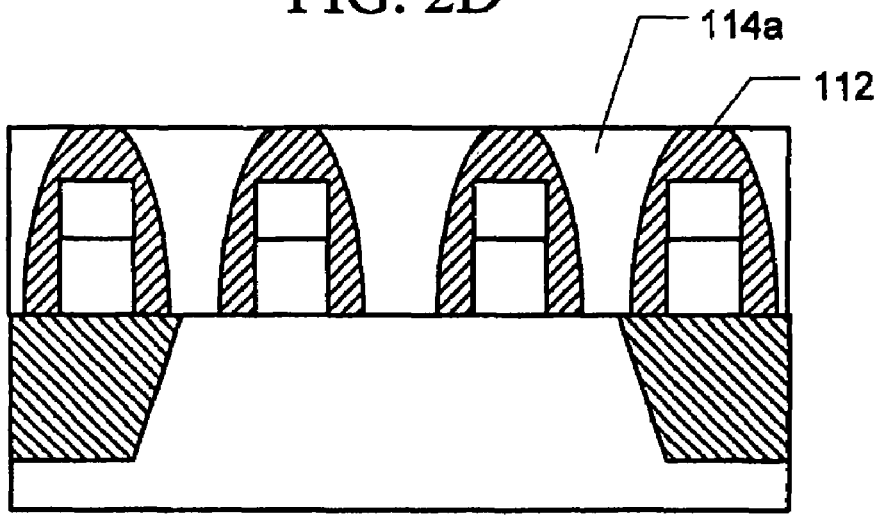

As illustrated in FIG. 2B-C, the upper portion of the polysilicon layer 114 is then removed to form polysilicon plugs 114a between the spacer structures 112. However, because the polysilicon is being removed with CMP process using an exemplary slurry composition including one or more of the polymeric surfactants, a passivation layer 200 is formed on the surface of the polysilicon layer, thereby suppressing the rate at which the polysilicon will be removed. As the covering polysilicon layer 114 is removed to expose the spacer structures 112, the remaining portions of the passivation layer 200a will be substantially confined to the remaining polysilicon regions, thereby allowing substantially normal removal of the material(s) comprising the spacer structures. As a result, the depth of any depressions 116 formed between the spacer structures is reduced and a generally planar surface may be produced. As illustrated in FIG. 2E, however, the passivation layer formed on the polysilicon surfaces may be sufficient to produce a substantially planar surface exposing upper surfaces of the spacer structures and with almost no appreciable depressions corresponding to the polysilicon surfaces.

Figure 2F:
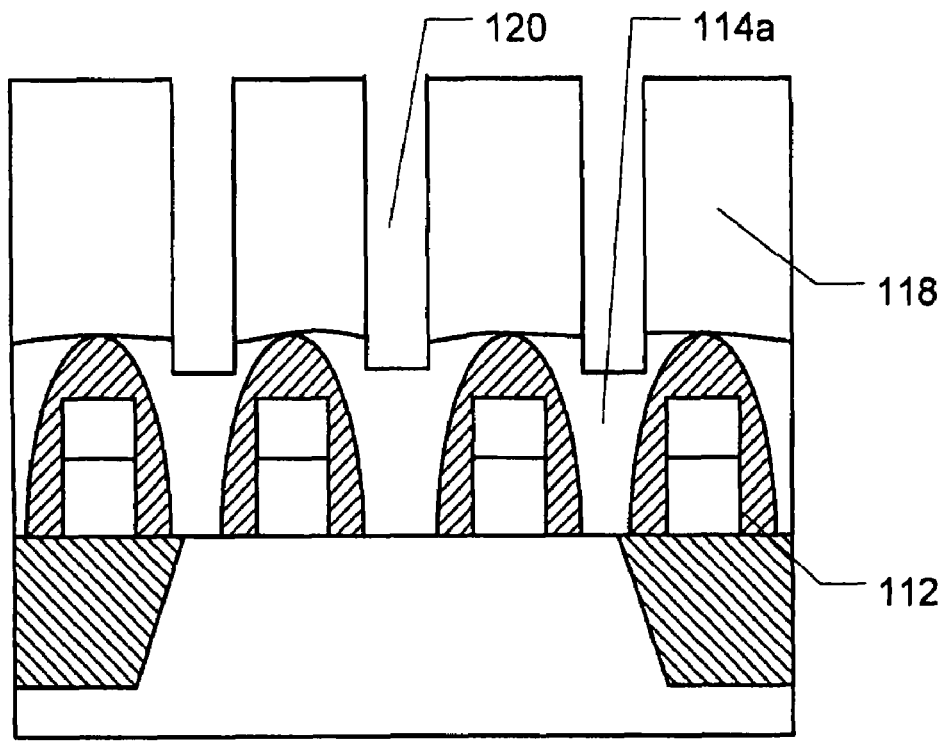
Figure 2G:
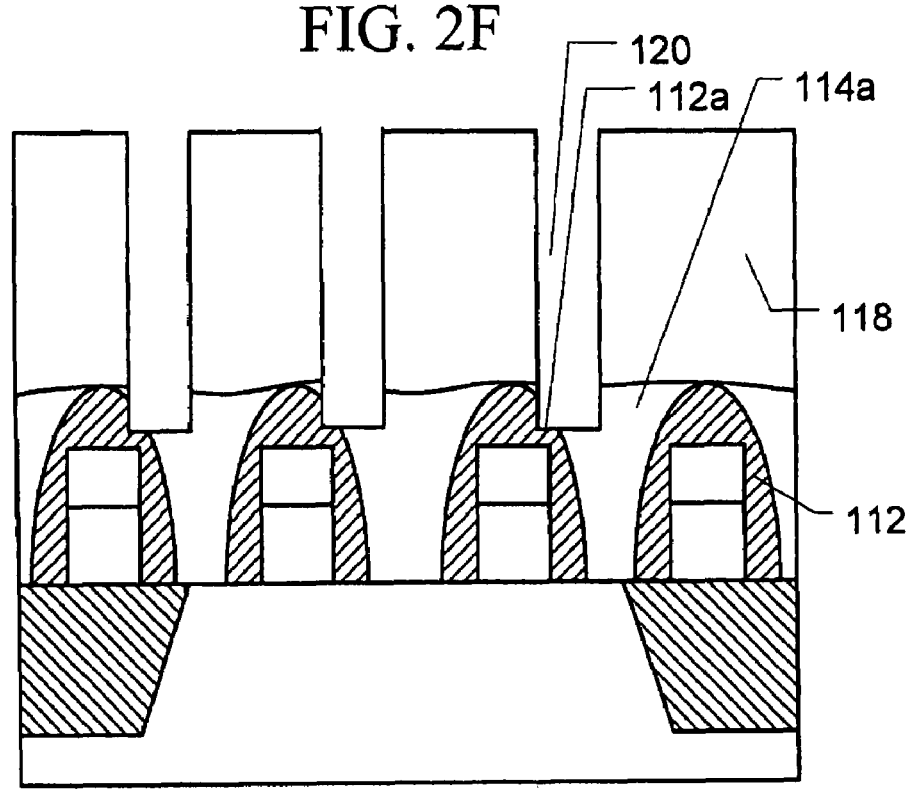
Figure 3A:
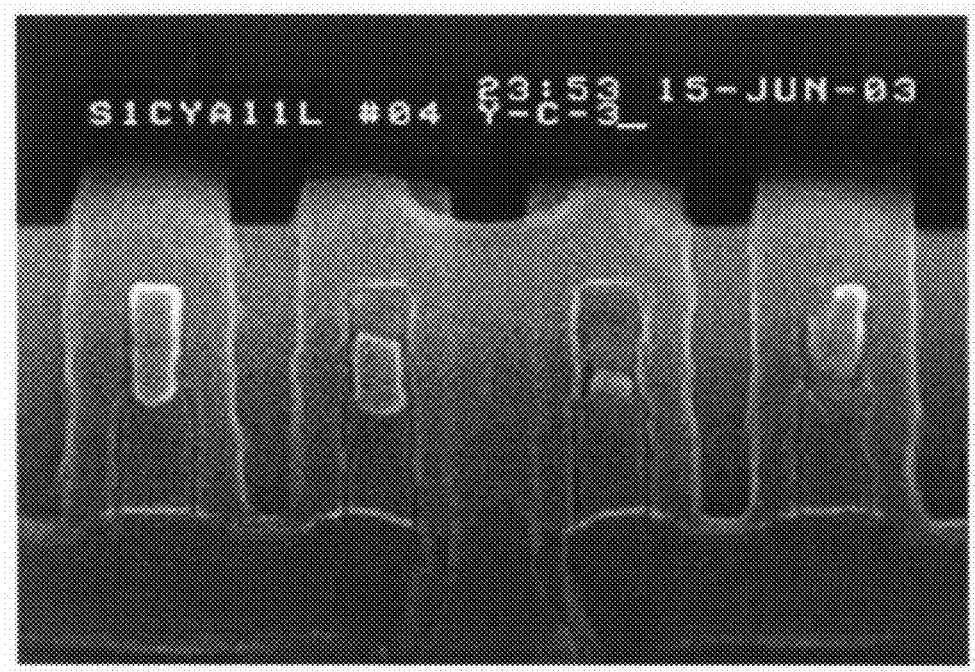
FIGS. 3A-B are SEM images illustrating cross-sections of semiconductor devices manufactured according to the conventional method and an exemplary inventive method respectively.
Figure 3B:
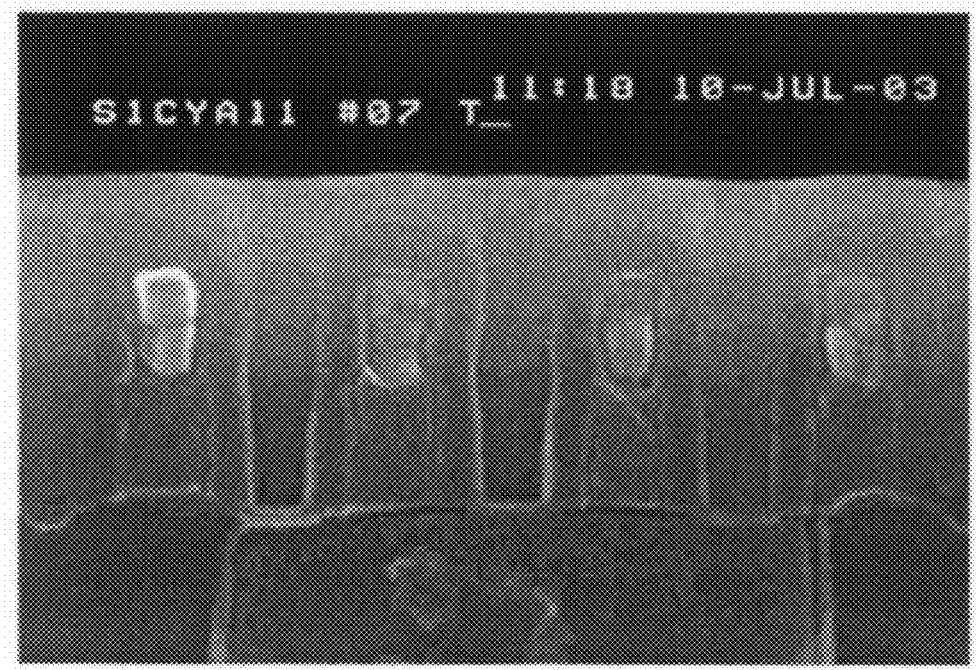

As illustrated in FIGS. 2F-G, once the CMP process has been completed, an interlayer dielectric layer (ILD) 118, may be deposited on the substrate. A photoresist contact pattern (not shown) will then be formed on the ILD 118 and the ILD material subsequently etched to form contact openings 120 that extend through the ILD to expose a surface of the polysilicon plugs 114a.

Figure 1E:
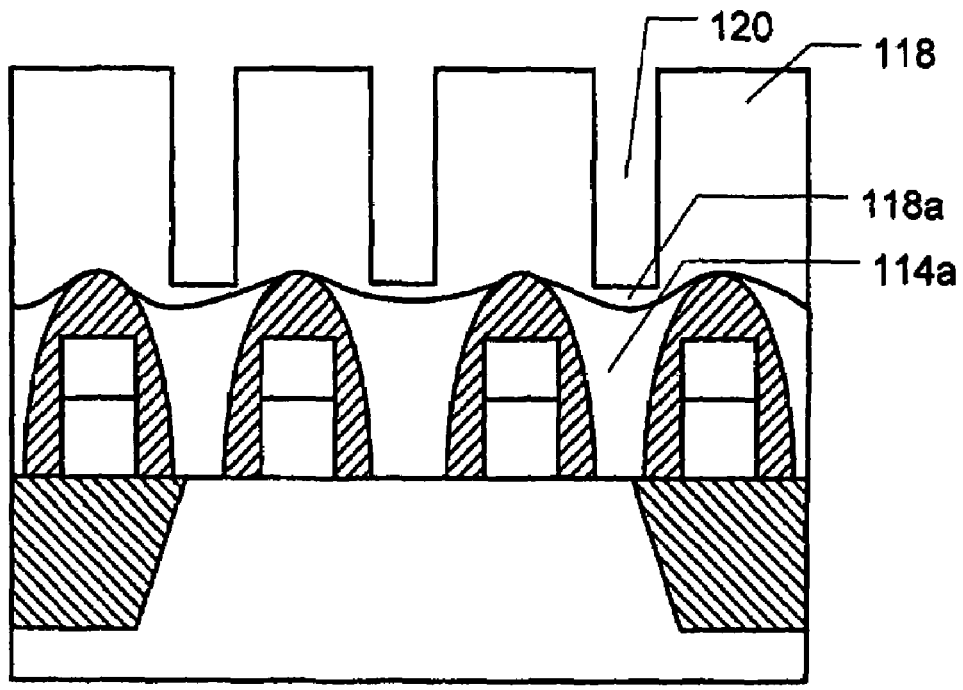

However, by suppressing the polysilicon removal through use of the polymeric surfactant, the exemplary slurry compositions are able to maintain the surface of the polysilicon plugs 114a in substantially planar orientation with the upper surfaces of the spacer structures 112. As a result, the contact openings may be etched to expose the upper surface of the polysilicon plugs 114a as illustrated in FIG. 2E and decrease the likelihood of an underetch condition as illustrated in FIG. 1E.

Figure 1F:
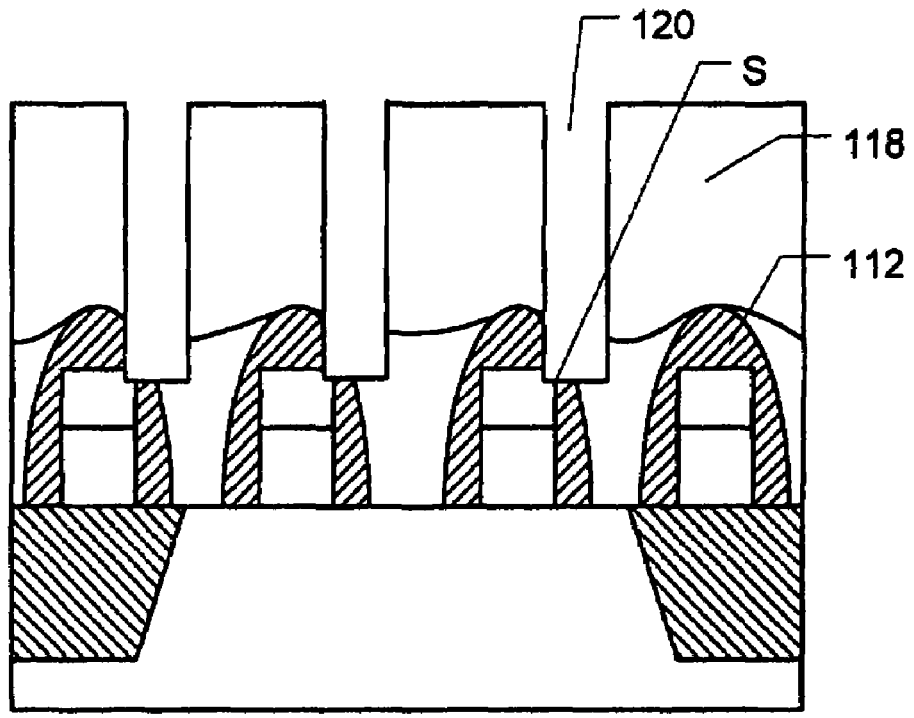

Similarly, as illustrated in FIG. 2F, by avoiding excessive removal of the polysilicon, increasing the height of the polysilicon plug 114a relative to the gate structure 106 and the spacer structure 112 provides additional overetch margin. As a result of the additional margin, it is more likely that a sufficient portion of the spacer structure 112a will remain after the contact etch process has been completed whereby a misaligned contact pattern is less likely to result in gate shorts. This additional etch margin will thereby decrease the likelihood of the situation illustrated in FIG. 1F. Because both opens and shorts will reduce the process yield and/or reduce the reliability of the final semiconductor devices, the reduction of these defects associated with CMP processes using slurry compositions according to the present invention may increase the process yield and/or reliability of the resulting devices.

As described above, according to the present invention, one or more exemplary polymers having both hydrophilic and hydrophobic functional groups may be incorporated into a CMP slurry used in removing an upper portion of a polysilicon layer. The configuration of the exemplary polymers produce a passivation layer on hydrophobic surfaces, e.g., polysilicon, that suppresses the removal rate of the polysilicon relative to silicon nitride and silicon oxide, thus reducing or eliminating the cupping or dishing concerns associated with excessive polysilicon and improving the planarity of the resulting surface.

Comparative Experimental Data

Semiconductor substrates corresponding to FIG. 2A were prepared and then subjected to a CMP process to remove the upper portion of the polysilicon layer and expose upper surfaces of the spacer structures. A conventional, commercially available slurry composition was obtained that included a silica abrasive having an average particle size of about 30 nm, a solids content of less than about 30 wt % and a pH modifier to maintain a pH of at least 7 during the CMP process.

This conventional slurry composition in both unmodified form and as modified by the addition of about 0.02 vol % of a polymeric surfactant according to the exemplary embodiments of the present invention to prepare a exemplary slurry composition. Test substrates were then polished under substantially identical CMP conditions using the conventional and exemplary slurry compositions.

Figure 4:
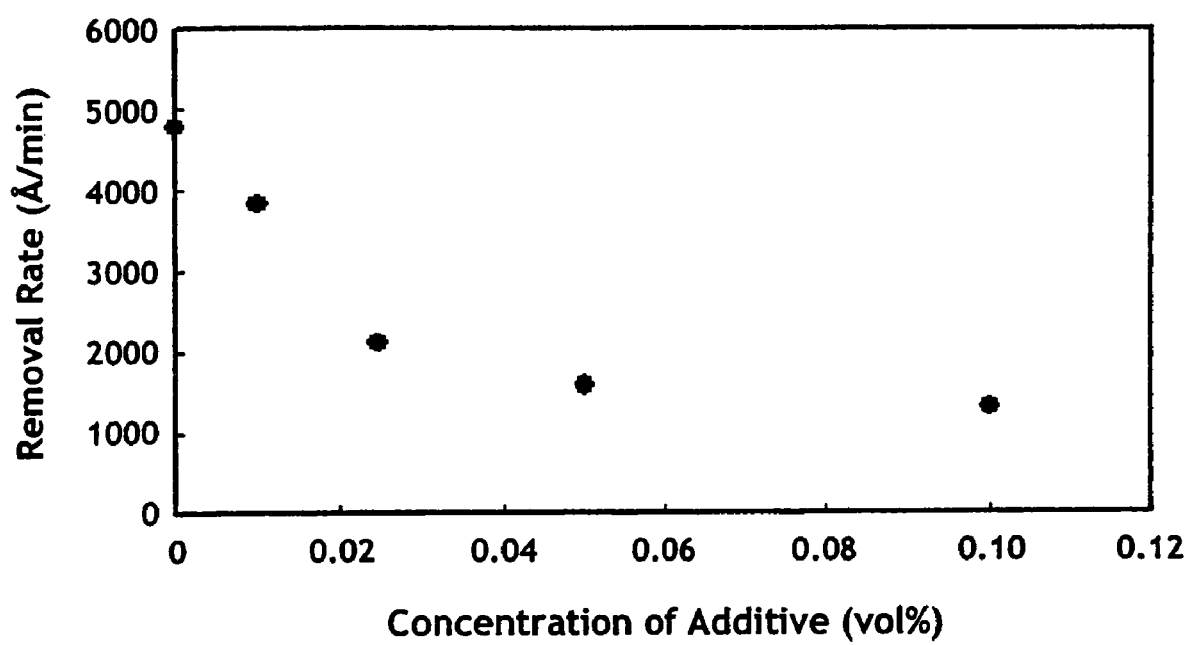
FIG. 4 is a graph illustrating the correlation between the amount of polymer included in the abrasive slurry composition and the polysilicon removal rate under substantially identical CMP process settings.

After the polishing was completed, the polished substrates were cross-sectioned and imaged on a scanning electron microscope (SEM) to produce micrographs reproduced as FIGS. 4A and B. As reflected in the FIG. 4A, the conventional abrasive slurry composition resulted in distinct cupping of the polysilicon regions between the spacer structures. Conversely, the addition of the minor amount of polymeric surfactant according to the invention was sufficient to suppress the excessive removal of the polysilicon layer. The magnitude of the polysilicon recesses reflected in the samples was then evaluated to generate the data reflected in TABLE 1.

TABLE 1

| Slurry Composition | Mean Depth of Recess (Å) |
|---|---|
| no exemplary surfactant | 214 |
| 0.02 vol % exemplary surfactant | 18 |

As reflected in TABLE 1, therefore, even the addition of a relatively minor portion of the exemplary polymeric surfactants, i.e., 0.02 vol %, produced a reduction in the depth of the polysilicon recess of more than 90%. The consumption of the exemplary polymeric surfactants in a CMP process may be reduced by limiting its use to only the final portion of the polysilicon CMP process. This practice, by not prematurely suppressing the polysilicon removal, will allow process throughput to be maintained at near conventional levels while still providing the improved planarity of the exemplary CMP methods.

It will be apparent to those skilled in the art that other changes and modifications may be made in the above-described CMP methods and slurry compositions without departing from the scope of the invention herein, and it is intended that all matter contained in the above description shall be interpreted in an illustrative and not a limiting sense.

We claim:

1. A method of partially removing a polysilicon layer formed over silicon nitride structures from a major surface of a substrate comprising:
    applying a first abrasive slurry to a polishing surface of a polishing pad, the first abrasive slurry having a first target slurry pH;
    causing relative motion between the substrate and the polishing pad in a plane generally parallel to the major surface of the substrate while applying a force tending to bring the major surface and the polishing surface into contact;
    polishing the major surface of the substrate with the first abrasive slurry to remove a first portion of the polysilicon layer from the major surface of the substrate to form an intermediate polished polysilicon surface;

applying a second abrasive slurry to the polishing surface of the polishing pad, the second abrasive slurry having a second slurry pH of at least 7;

causing relative motion between the substrate and the polishing pad in a plane generally parallel to the major surface of the substrate while applying a force tending to bring the major surface and the polishing surface into contact;

polishing the major surface of the substrate with the second abrasive slurry to remove a second portion of the polysilicon layer from the major surface of the substrate to form a final polished polysilicon surface and expose a surface of the silicon nitride structure, the final polished polysilicon surface and the exposed surface of the silicon nitride being substantially coplanar, wherein the first abrasive slurry is substantially free of all surfactants that will selectively form a passivation layer on the polysilicon layer and the second abrasive slurry includes a non-ionic surfactant that will selectively form a passivation layer on the polysilicon layer.

2. A method of removing an upper portion of a polysilicon layer formed over a pattern including a stopping layer comprising:

polishing the polysilicon layer with an abrasive slurry to remove the upper portion of the polysilicon layer and form a polished polysilicon surface and expose an upper surface of the stopping layer, the polished polysilicon surface and the exposed surface of the stopping layer being substantially coplanar, wherein the abrasive slurry includes a non-ionic surfactant that selectively forms a passivation layer on the polysilicon layer, the non-ionic surfactant including one or more surfactants selected from the group consisting of ethylene oxide-propylene oxide block copolymer alcohols represented by the formula I

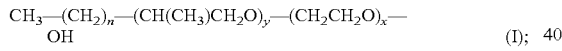  (I);

ethylene oxide-propylene oxide block copolymer aryl alcohols represented by the formula II

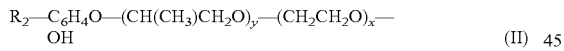  (II)

wherein

R$_2$ is —C$_9$H$_{19}$ or —C$_8$H$_{17}$;

ethylene oxide-propylene oxide-ethylene oxide tri-block polymers represented by the formula III

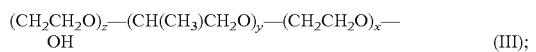  (III);

and propylene oxide-ethylene oxide-propylene oxide tri-block polymers represented by the formula IV

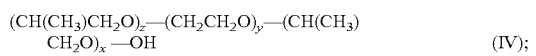  (IV);

wherein n is an integer satisfying the relationship $3 \leq n \leq 22$;
z is an integer satisfying the relationship $1 \leq z \leq 30$
y is an integer satisfying the relationship $1 \leq y \leq 30$; and
x is an integer satisfying the relationship $1 \leq x \leq 30$.

3. A method of removing an upper portion of a polysilicon layer formed over silicon nitride and silicon dioxide structures from a major surface of a substrate comprising:

applying an abrasive slurry to a polishing surface of a polishing pad, the abrasive slurry having a target slurry pH;

causing relative motion between the substrate and the polishing pad in a plane generally parallel to the major surface of the substrate while applying a force tending to bring the major surface and the polishing surface into contact;

polishing the major surface of the substrate with the abrasive slurry to remove the upper portion of the polysilicon layer from the major surface of the substrate to form a polished polysilicon surface, expose a surface of the silicon nitride structure and expose a surface of the silicon dioxide structure, the polished polysilicon surface and the exposed surface of the silicon nitride structure being substantially coplanar, wherein the abrasive slurry includes a non-ionic surfactant that selectively forms a passivation layer on the polysilicon layer, the non-ionic surfactant including one or more surfactants selected from the group consisting of ethylene oxide-propylene oxide block copolymer alcohols represented by the formula I

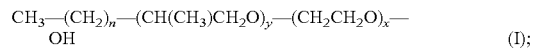  (I);

ethylene oxide-propylene oxide block copolymer aryl alcohols represented by the formula II

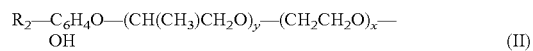  (II)

wherein

R$_2$ is —C$_9$H$_{19}$ or —C$_8$H$_{17}$;

ethylene oxide-propylene oxide-ethylene oxide tri-block polymers represented by the formula III

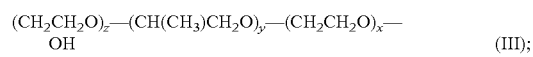  (III);

and propylene oxide-ethylene oxide-propylene oxide tri-block polymers represented by the formula IV

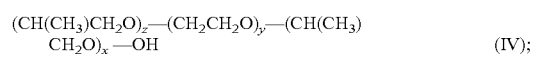  (IV);

wherein n is an integer satisfying the relationship $3 \leq n \leq 22$;
z is an integer satisfying the relationship $1 \leq z \leq 30$
y is an integer satisfying the relationship $1 \leq y \leq 30$; and
x is an integer satisfying the relationship $1 \leq x \leq 30$.

4. A method of manufacturing a semiconductor device comprising:

forming a conductive pattern;

forming insulating spacers from an insulating material, the insulating spacers encompassing the conductive pattern to form a protected pattern;

depositing a polysilicon layer on insulating spacers;

removing an upper portion of the polysilicon layer using chemical-mechanical polishing with an abrasive slurry to expose an upper surface of the insulating spacers and form a polished polysilicon surface;

depositing an interlevel oxide (ILO); and forming contact openings in the interlevel oxide to expose portions of the polished polysilicon surface;

wherein the abrasive slurry includes one or more polymeric surfactants that form a passivation layer on the polysilicon, the surfactants being selected from the group consisting of ethylene oxide-propylene oxide block copolymer alcohols represented by the formula I

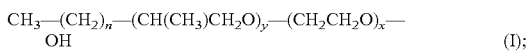 (I);

ethylene oxide-propylene oxide block copolymer aryl alcohols represented by the formula II

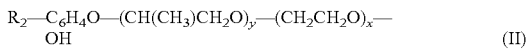 (II)

wherein
R$_2$ is —C$_9$H$_{19}$ or —C$_8$H$_{17}$;
ethylene oxide-propylene oxide-ethylene oxide tri-block polymer alcohols represented by the formula III

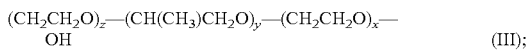 (III);

and
propylene oxide-ethylene oxide-propylene oxide tri-block polymer alcohols represented by the formula IV

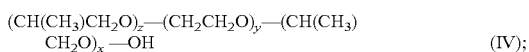 (IV);

wherein
n is an integer satisfying the relationship $3 \leq n \leq 22$;
z is an integer satisfying the relationship $1 \leq z \leq 30$
y is an integer satisfying the relationship $1 \leq y \leq 30$; and
x is an integer satisfying the relationship $1 \leq x \leq 30$;
whereby a selectivity ratio between a polysilicon removal rate and an insulator removal rate is reduced by at least about 50% by the formation of the passivation layer.

5. A method of partially removing a polysilicon layer according to claim 1, wherein:
the second abrasive slurry is formed by introducing at least about 0.001 wt % of the non-ionic surfactant into the first abrasive slurry.

6. A method of partially removing a polysilicon layer according to claim 1, wherein:
the non-ionic surfactant is combined with the first abrasive slurry to form the second abrasive slurry before the second abrasive slurry is applied to the polishing surface.

7. A method of partially removing a polysilicon layer according to claim 1, wherein:
the non-ionic surfactant includes one or more surfactants is selected from the group consisting of
ethylene oxide-propylene oxide block copolymer alcohols represented by the formula I

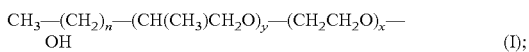 (I);

ethylene oxide-propylene oxide block copolymer aryl alcohols represented by the formula II

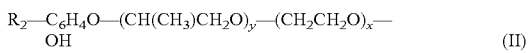 (II)

wherein
R$_2$ is —C$_9$H$_{19}$ or —C$_8$H$_{17}$;
ethylene oxide-propylene oxide-ethylene oxide tri-block polymer alcohols represented by the formula III

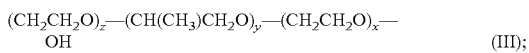 (III);

and
propylene oxide-ethylene oxide-propylene oxide tri-block polymer alcohols represented by the formula IV

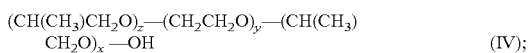 (IV);

wherein
n is an integer satisfying the relationship $3 \leq n \leq 22$;
z is an integer satisfying the relationship $1 \leq z \leq 30$
y is an integer satisfying the relationship $1 \leq y \leq 30$; and
x is an integer satisfying the relationship $1 \leq x \leq 30$.

8. A method of partially removing a polysilicon layer according to claim 2, wherein:
the polished polysilicon surface is on average less than 50 Å from a plane defined by the exposed stopping layer surface adjacent the polished polysilicon surface.

9. A method of partially removing a polysilicon layer according to claim 2, wherein:
the polished polysilicon surface is on average less than 25 Å from a plane defined by the exposed stopping layer surface adjacent the polished polysilicon surface.

10. A method of partially removing a polysilicon layer according to claim 3, wherein:
the non-ionic surfactant is at least 0.001 wt % of the abrasive slurry.

11. A method of partially removing a polysilicon layer according to claim 10, wherein:
the abrasive slurry has a slurry pH of between about 7 and 12.

12. A method of partially removing a polysilicon layer according to claim 10, wherein:
the abrasive slurry includes a second surfactant, the second surfactant selectively forming a second passivation layer on the surface of the silicon nitride structure, thereby altering a removal rate of silicon nitride relative to removal rates of silicon oxide and polysilicon during the polishing.

13. A method of partially removing a polysilicon layer according to claim 11, wherein:
the abrasive slurry has a slurry pH of between about 10 and 11.

14. A method of partially removing a polysilicon layer according to claim 12, wherein:
the second surfactant includes an imine or amine compound and is present at a concentration of between about 0.001 and 10 wt % of the abrasive slurry composition.

15. A method of manufacturing a semiconductor device according to claim 4, wherein:
the insulating material includes at least one material selected from a group consisting of silicon nitride, silicon oxide and silicon oxynitride.

16. A method of manufacturing a semiconductor device according to claim 4, wherein:
the polished polysilicon surface is on average less than 50 Å from a plane defined by the exposed upper surfaces of adjacent insulating spacers.

17. A method of manufacturing a semiconductor device according to claim 4, wherein:
the polished polysilicon surface is on average less than 25 Å from a plane defined by the exposed upper surfaces of adjacent insulating spacers.

18. A method of manufacturing a semiconductor device according to claim 4, wherein:
the abrasive slurry includes a first slurry that is substantially free of polymeric surfactants capable of forming the passivation layer on the exposed polysilicon surface, the first slurry being utilized during the removal of a first portion of the polysilicon layer; and
a second slurry that includes a quantity of one or more of the polymeric surfactants capable of forming the passivation layer on the exposed polysilicon surface, the second slurry being utilized during the removal of a second portion of the polysilicon layer sufficient to expose the upper surfaces of the insulating spacers.

19. A method of manufacturing a semiconductor device according to claim 18, wherein:
a total quantity of the one or more polymeric surfactants is between about 0.005 and about 0.2 wt % of the second abrasive slurry.

20. A method of manufacturing a semiconductor device according to claim 18, wherein:
a total quantity of the one or more polymeric surfactants is between about 0.005 and about 0.02 wt % of the second abrasive slurry.

* * * * *